(12) United States Patent
Chopin et al.

(10) Patent No.: US 10,199,339 B2
(45) Date of Patent: Feb. 5, 2019

(54) SEMICONDUCTOR STRUCTURE WITH SACRIFICIAL ANODE AND METHOD FOR FORMING

(71) Applicant: FREESCALE SEMICONDUCTOR, INC., Austin, TX (US)

(72) Inventors: Sheila F. Chopin, Austin, TX (US); Min Ding, Austin, TX (US); Varughese Mathew, Austin, TX (US); Scott S. Roth, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/215,037

(22) Filed: Jul. 20, 2016

(65) Prior Publication Data

US 2016/0329288 A1     Nov. 10, 2016

Related U.S. Application Data

(62) Division of application No. 13/898,949, filed on May 21, 2013, now Pat. No. 9,412,709.

(51) Int. Cl.
*H01L 23/00* (2006.01)
*H01L 23/31* (2006.01)

(52) U.S. Cl.
CPC ............ *H01L 24/02* (2013.01); *H01L 24/03* (2013.01); *H01L 24/05* (2013.01); *H01L 24/45* (2013.01); *H01L 24/48* (2013.01); *H01L 23/3192* (2013.01); *H01L 24/13* (2013.01); *H01L 2224/0218* (2013.01); *H01L 2224/0219* (2013.01); *H01L 2224/02166* (2013.01); *H01L 2224/034* (2013.01); *H01L 2224/03005* (2013.01); *H01L 2224/03009* (2013.01); *H01L 2224/03015* (2013.01); *H01L 2224/03019* (2013.01); *H01L 2224/0391* (2013.01); *H01L 2224/03622* (2013.01); *H01L 2224/0401* (2013.01); *H01L 2224/04042* (2013.01); *H01L 2224/05* (2013.01);
(Continued)

(58) Field of Classification Search
CPC ......... H01L 24/02; H01L 24/03; H01L 24/05; H01L 24/45; H01L 24/48
See application file for complete search history.

(56) References Cited

U.S. PATENT DOCUMENTS 5,686,162 A * 11/1997 Polak ................... H01L 23/293
                                                                   174/521
8,183,683 B1   5/2012   Kim et al.
(Continued)

OTHER PUBLICATIONS

Khadom, A. et al., "Prevention of Steel Corrosion by Cathodic Protection Techniques", International Journal of Chemical Technology, vol. 4, No. 1, pp. 17-30, 2012.
Loto, C. et al., "Effect of anode and size variations on the cathodic protection of mild steel in sea water and sulphuric acid", International Journal of the Physical Sciences, vol. 6, No. 12., pp. 2861-2868, Jun. 18, 2011.

*Primary Examiner* — Long Pham (57) ABSTRACT

A packaged semiconductor device is made by forming a conductive pad on an external surface of an integrated circuit device, forming a passivation layer over the conductive pad, removing a portion of the passivation layer over a bond area on the conductive pad, forming a sacrificial anode around a majority of a periphery surrounding the bond area, forming a conductive bond in the bond area, and forming an encapsulating material around the conductive bond and an exposed portion of the sacrificial anode.

19 Claims, 8 Drawing Sheets

(52) U.S. Cl.
CPC ............... *H01L 2224/05565* (2013.01); *H01L 2224/05567* (2013.01); *H01L 2224/05624* (2013.01); *H01L 2224/131* (2013.01); *H01L 2224/13147* (2013.01); *H01L 2224/32145* (2013.01); *H01L 2224/45124* (2013.01); *H01L 2224/45147* (2013.01); *H01L 2224/48227* (2013.01); *H01L 2224/48463* (2013.01); *H01L 2224/48507* (2013.01); *H01L 2224/48824* (2013.01); *H01L 2224/73265* (2013.01); *H01L 2924/0103* (2013.01); *H01L 2924/01012* (2013.01); *H01L 2924/01029* (2013.01); *H01L 2924/10253* (2013.01); *H01L 2924/10271* (2013.01); *H01L 2924/10329* (2013.01); *H01L 2924/14* (2013.01); *H01L 2924/365* (2013.01); *H01L 2924/3651* (2013.01)

(56) References Cited

U.S. PATENT DOCUMENTS

| | | |
|---|---|---|
| 9,184,092 B2 * | 11/2015 | Yen .......................... B81B 7/007 |
| 2007/0262435 A1 | 11/2007 | Lam |
| 2008/0199996 A1 | 8/2008 | Muralidhar et al. |
| 2010/0264414 A1 | 10/2010 | Homma et al. |
| 2011/0209899 A1 | 9/2011 | Hill |
| 2011/0266681 A1 | 11/2011 | Fix et al. |
| 2012/0043661 A1 | 2/2012 | Lindsay |
| 2013/0111954 A1 * | 5/2013 | Murphy .............. C03C 17/3423 |
| | | 65/60.2 |
| 2013/0193576 A1 | 8/2013 | Mathew |
| 2013/0277825 A1 * | 10/2013 | Zhang ................... H01L 23/293 |
| | | 257/734 |

* cited by examiner

SEMICONDUCTOR STRUCTURE WITH SACRIFICIAL ANODE AND METHOD FOR FORMING

This application is a divisional application of a U.S. patent application entitled "Semiconductor Structure With Sacrificial Anode and Method for Forming", having a Ser. No. 13/898,949, having a filing date of May 21, 2013, having common inventors, and having a common assignee, all of which is incorporated by reference in its entirety.

BACKGROUND

Field

This disclosure relates generally to semiconductor processing, and more specifically, to a semiconductor structure with sacrificial anode.

Related Art

With copper wire bond technology, corrosive species from surrounding materials, such as the encapsulant, die attach epoxy, and substrate migrate under moisture, temperature, and voltage environments to the intermetallic compound (IMC) of the wire bond causing corrosion. This corrosion results in open failures of the wire bonds, such as during temperature/humidity reliability testing.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In order to prevent corrosive species from attacking the wire bond IMC, a sacrificial anode is formed in order to attract the corrosive species. In this manner, the sacrificial anode is corroded instead of the IMC, thus resulting in improved reliability of the wire bond.

Figure 1:
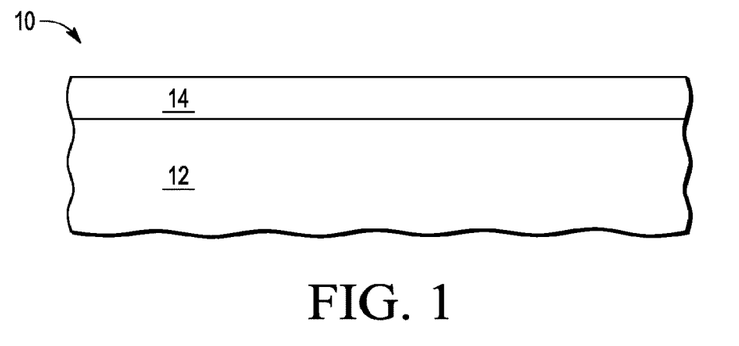
FIGS. 1-11 illustrate cross sectional views of a semiconductor structure at various stages in processing, in accordance with an embodiment.

FIG. 1 illustrates, in cross sectional form, a portion of a semiconductor structure 10 having a semiconductor wafer 12 and a conductive layer 14 formed over wafer 12. Wafer 12 may include any type of semiconductor substrate with active circuitry formed in and on the semiconductor substrate. Wafer 12 also includes any number of interconnect layers formed over the structure which may provide connections between the active circuitry and bond pads which may be formed from conductive layer 14. In one embodiment, conductive layer 14 is blanket deposited over wafer 12 and includes a metal, such as aluminum. Conductive layer 14 will be used to form bond pads on a top surface of wafer 12.

Figure 2:
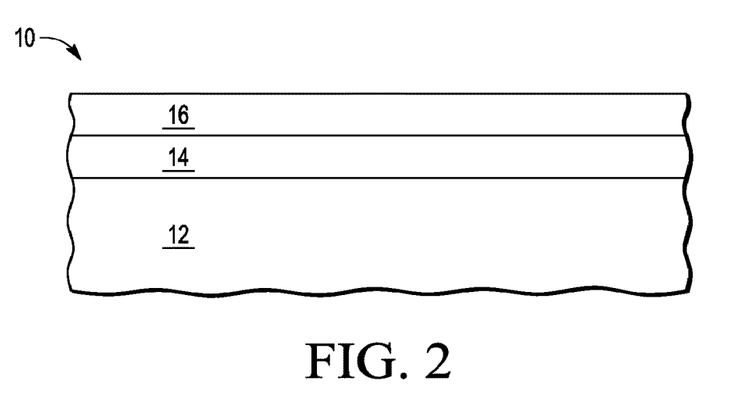

FIG. 2 illustrates, in cross sectional form, semiconductor structure 10 after formation of a sacrificial layer 16 over conductive layer 14. Sacrificial layer 16 may be blanket deposited over conductive layer 14. Sacrificial layer 16 includes a material having a higher redox potential than that of conductive layer 14. For example, in one embodiment, sacrificial layer 16 may include magnesium, zinc, etc., and alloys thereof. Sacrificial layer 16 includes a material which preferably corrodes relative to one or more elements of the wirebonded system, such as the IMC, the bond pad, wire, etc.

Figure 3:
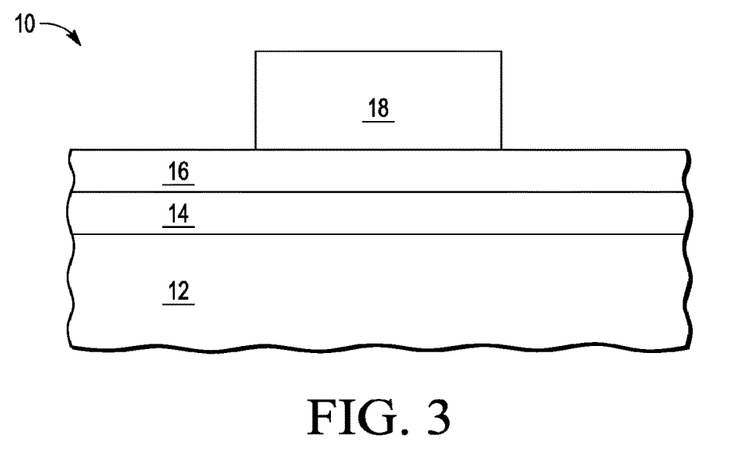

FIG. 3 illustrates, in cross sectional form, semiconductor structure 10 after formation of a patterned masking layer 18 over sacrificial layer 16. Patterned masking layer 18 may be a photo resist layer and defines a bond pad to be formed from conductive layer 14. Note that patterned masking layer 18 may define any number of bond pads to be formed from conductive layer 14.

Figure 4:
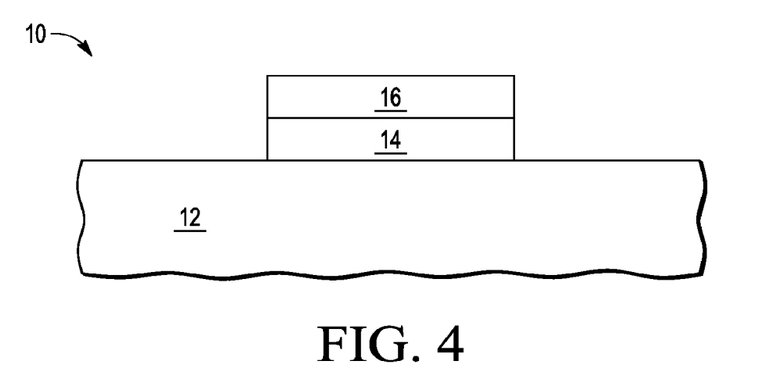

FIG. 4 illustrates, in cross sectional form, semiconductor structure 10 after etching conductive layer 14 and sacrificial layer 16 using patterned masking layer 18. Patterned masking layer 18 is then removed. Therefore, a remaining portion of conductive layer 14, as illustrated in FIG. 4, forms a bond pad (which may be referred to as bond pad 14 or conductive pad 14) on a top surface of wafer 12. A remaining portion of sacrificial layer 16 remains on a major surface of bond pad 14.

Figure 5:
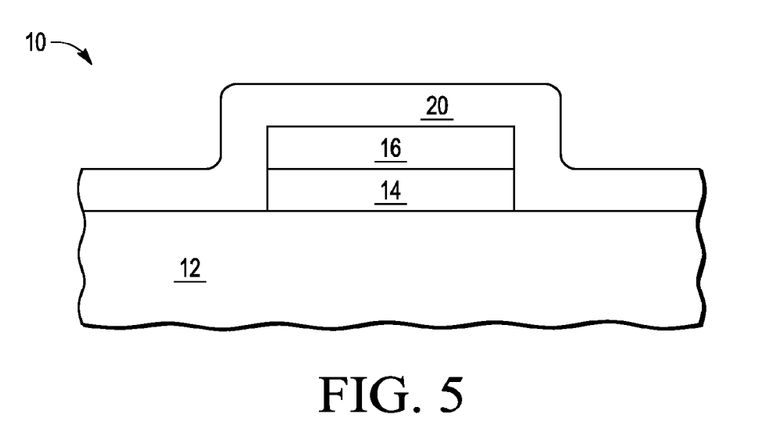

FIG. 5 illustrates, in cross sectional form, semiconductor structure 10 after formation of a sacrificial layer 20 over sacrificial layer 16 and bond pad 14 and over wafer 12. In one embodiment, sacrificial layer 20 is blanket deposited over wafer 12 and is thus formed on sidewalls of sacrificial layer 16 and bond pad 14. Sacrificial layer 20 may include a material having a higher redox potential than that of conductive layer 14, and include the same or different material from sacrificial layer 16.

Figure 6:
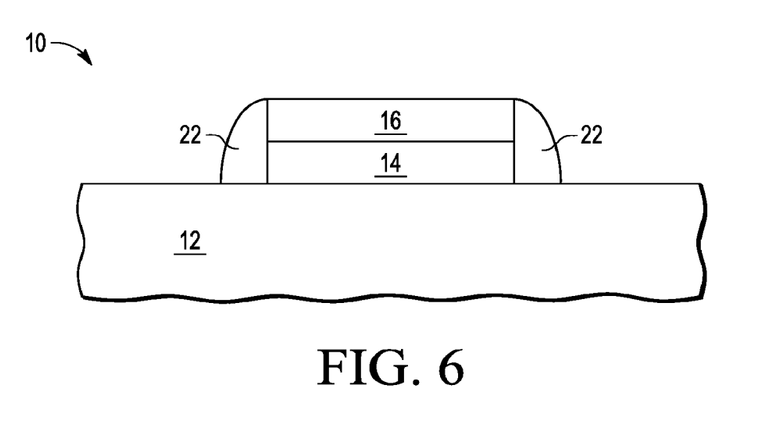

FIG. 6 illustrates, in cross sectional form, semiconductor structure 10 after performing an anisotropic etch which removes portions of sacrificial layer 20 and forms a sidewall portion 22 from sacrificial layer 20 which is adjacent sidewalls of sacrificial layer 16 and bond pad 14. Note that sidewall portion 22 is adjacent each of the four minor surfaces of bond pad 14, thus completely surrounds conductive layer 16 and bond pad 14 when viewed from a top-down perspective. Note that sidewall portion 22 may also be referred to as a spacer.

Figure 7:
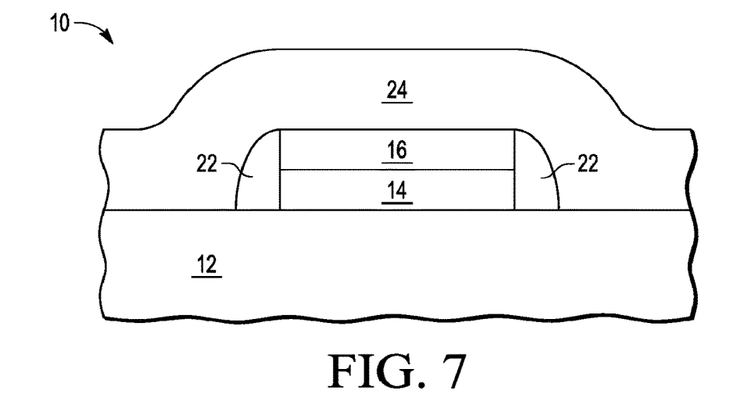

FIG. 7 illustrates, in cross sectional form, semiconductor structure 10 after formation of a passivation layer 24 over wafer 12, sacrificial layer 16, and sidewall portion 22. Passivation layer 24 may include one or more dielectric layers, in which each layer may be blanket deposited over wafer 12.

Figure 8:
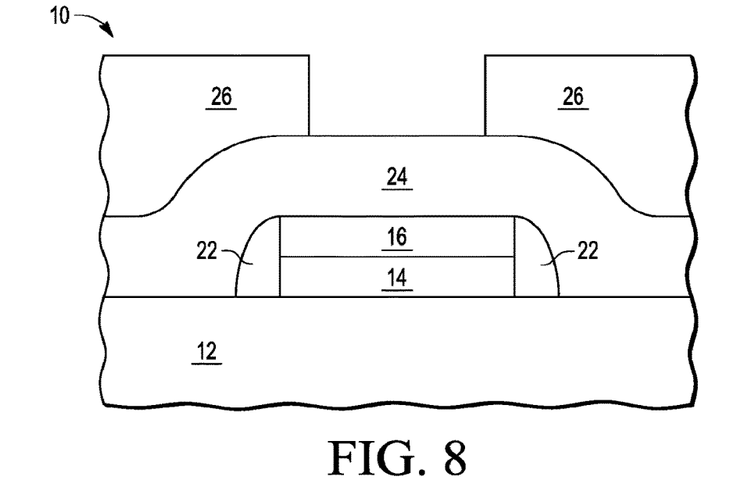

FIG. 8 illustrates, in cross sectional form, semiconductor structure 10 after forming of a patterned masking layer 26 over passivation layer 24. Patterned masking layer 26 may be a photo resist layer and defines an opening to be formed in passivation layer 24.

Figure 9:
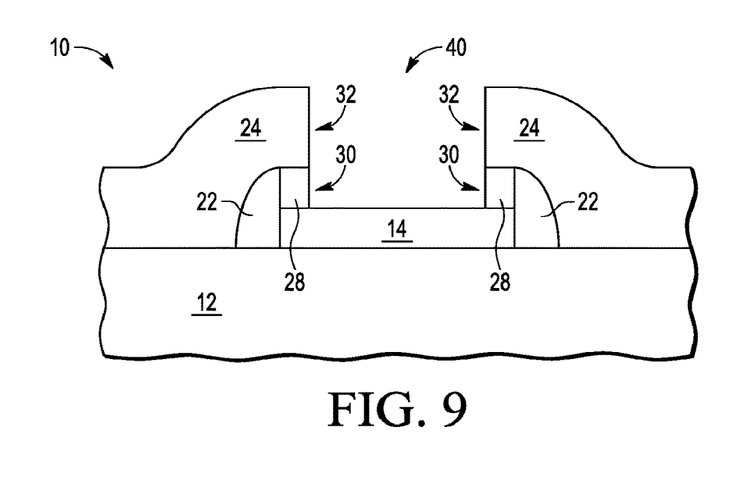

FIG. 9 illustrates, in cross sectional form, semiconductor structure 10 after using patterned masking layer 26 to form an opening 40 in passivation layer 14 and sacrificial layer 16 which exposes bond pad 14. Opening 40 is smaller than bond pad 14 such that a remaining portion of conductive layer 16 forms a sacrificial anode 28 on and in physical contact with bond pad 14. Opening 40 also exposes a sidewall 30 of sacrificial anode 28 and a sidewall 32 of passivation layer 24. Sidewalls 30 and 32 are over bond pad 14, substantially perpendicular to bond pad 14, and are aligned with each other. That is, since a single etch is performed to form opening 40 through both passivation layer 24 and sacrificial layer 16, sacrificial layer 16 is self-aligned with passivation layer 24. Opening 40 exposes a bond area of bond pad 14. As will be described below, a conductive bond will be formed on the bond area. Also, sacrificial anode 28 surrounds two or more peripheral edges of the bond area. In the illustrated embodiment, sacrificial anode 28 completely surrounds the bond area.

Figure 10:
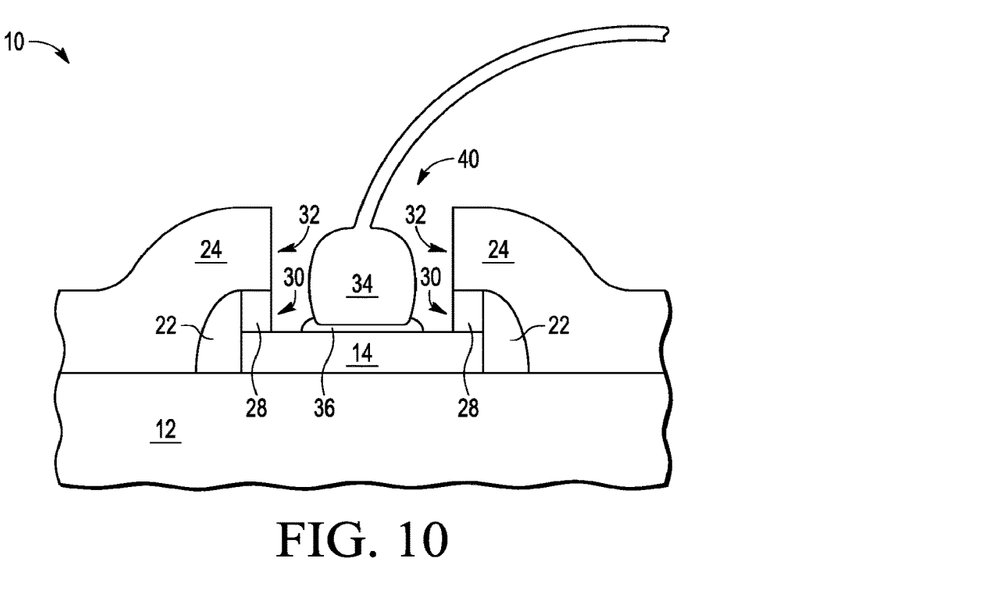

FIG. 10 illustrates, in cross section form, semiconductor structure 10 after formation of a wire bond 34 on a the bond area of a top major surface of bond pad 14. Wire bond 34 may be used to provide an electrical connection to/from the circuitry in wafer 12. Upon attaching wire bond 34 to bond pad 14, an intermetallic compound (IMC) 36 is formed between wire bond 34 and conductive layer 14. In one embodiment, wire bond 34 includes copper. In the embodiment in which bond pad 14 is aluminum and wire bond 34 is copper, IMC 36 includes a copper-aluminum intermetallic compound.

Figure 11:
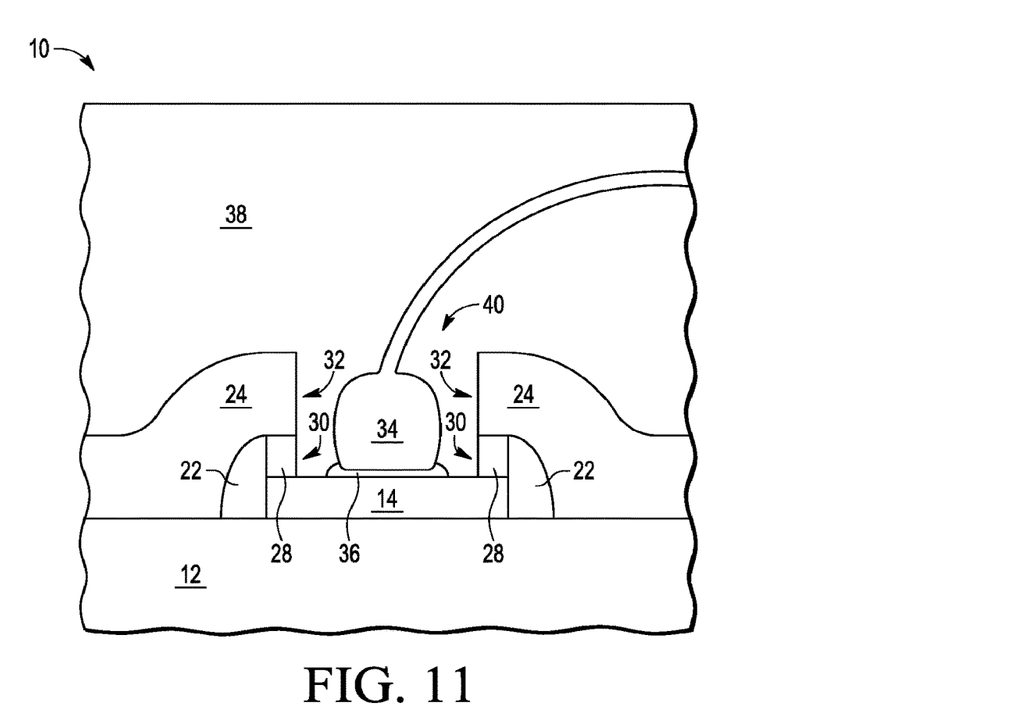

FIG. 11 illustrates, in cross section form, semiconductor structure 10 after encapsulation of structure 10 with an encapsulant 38. Encapsulant 38 fills opening 40, surrounding wire bond 34. Encapsulant 38 is therefore in direct contact with sidewall 30 of sacrificial anode 28 and with sidewall 32 of passivation 24. Since sacrificial anode 28 has a higher redox potential than the material of bond pad 14 and IMC 36, any corrosives from encapsulant 38 will preferentially migrate to sacrificial anode 28 and corrode sacrificial anode 28 prior to corroding IMC 36. Therefore, in one embodiment, sacrificial anode 28 has sufficient volume so as to receive the corrosives, thus detracting them from IMC 36. Note also that spacer 22 may also have a higher redox potential that the material of bond pad 14 and IMC 36 which may also attract corrosives from these materials. Note also that sacrificial anode 28, when viewed from a top-down perspective, completely surrounds IMC 36 and the ball portion of wire bond 34 that is on bond pad 14. In this manner, improved corrosion protection may be achieved. Although a wire bond is illustrated as being formed on the bond area of bond pad 14, other types of conductive bonds may be formed on the bond area, such as, for example, a conductive bump or pillar. For example, the conductive bond may be a solder bump such as in a ball grid array, a copper bump, or a copper pillar.

Figure 12:
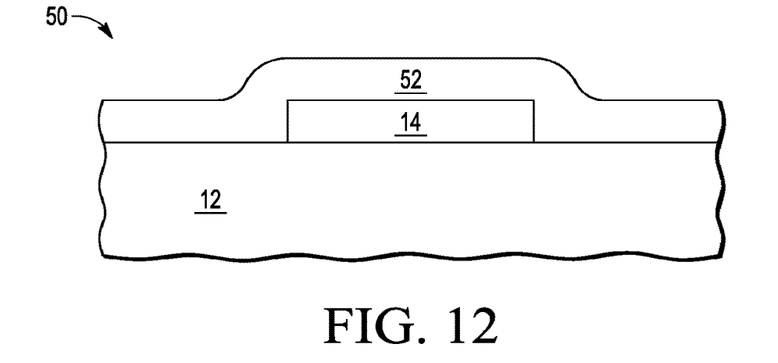
FIGS. 12-16 illustrate cross sectional views of a semiconductor structure at various stages in processing, in accordance with an embodiment.

FIG. 12 illustrates, in cross sectional form, a portion of a semiconductor structure 50 having semiconductor wafer 12 and bond pad 14 over wafer 12. As described above, in one embodiment, a conductive layer is blanket deposited over wafer 12 and subsequently patterned to form bond pad 14. A sacrificial layer 52 is formed over wafer 12, over a major surface of bond pad 14, and along sidewalls of bond pad 14. In one embodiment, sacrificial layer 52 is blanket deposited over wafer 12. Sacrificial layer 52 includes a material having a higher redox potential than that of bond pad 14. For example, in one embodiment, sacrificial layer 52 may include magnesium.

Figure 13:
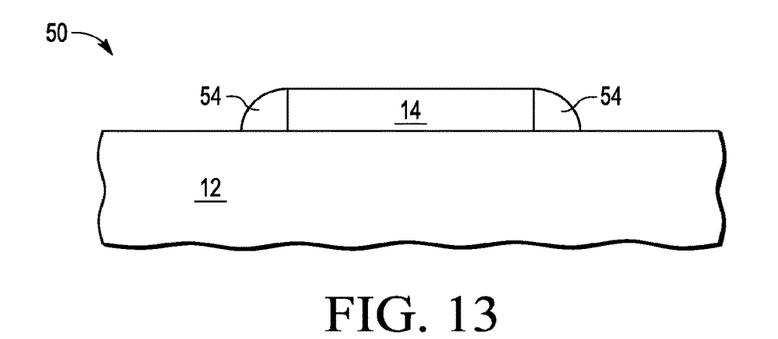

FIG. 13 illustrates, in cross sectional form, semiconductor structure 50 after performing an anisotropic etch of sacrificial layer 52 which results in a remaining sidewall portion 54 adjacent sidewalls of bond pad 14. Sidewall portion 54 may be referred to as sacrificial anode 54. Note that sacrificial anode 54 is formed adjacent each minor surface of bond pad 14 and thus, when viewed from a top-down perspective, surrounds bond pad 14.

Figure 14:
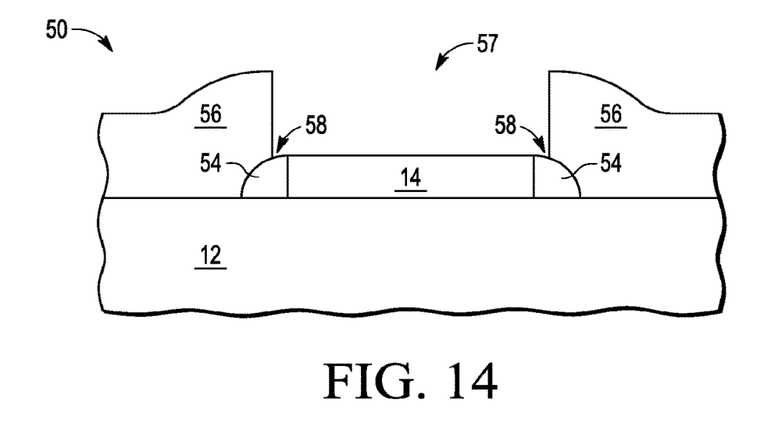

FIG. 14 illustrates, in cross section form, semiconductor structure 50 after forming a passivation layer 56 over wafer 12. Passivation layer 56 may include one or more dielectric layers. In one embodiment, each dielectric layer of passivation layer 56 is blanket deposited over wafer 12 and an opening 57 is formed through passivation layer 56 to expose bond pad 14 and a portion 58 of sacrificial anode 54. In the illustrated embodiment, opening 57 is larger than bond pad 14 which allows for portion 58 to be exposed. Note that bond pad 14 includes a bond area on which a conductive bond will subsequently be formed. Sacrificial anode 54 surrounds two or more periphery edges of the bond area. In the illustrated embodiment, sacrificial anode 54 completely surrounds the bond area.

Figure 15:
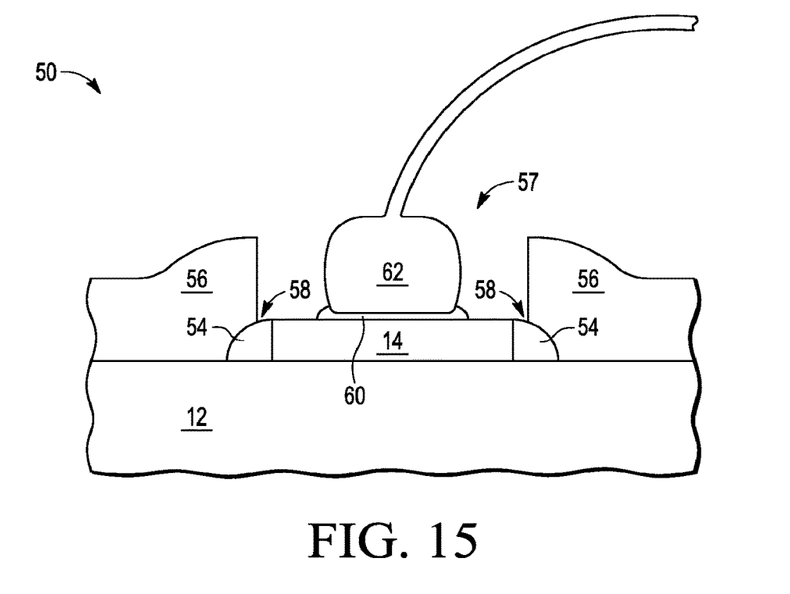

FIG. 15 illustrates, in cross sectional form, semiconductor structure 50 after attaching a wire bond 62 to the bond area of the top major surface of bond pad 14. Wire bond 62 may be used to provide an electrical connection to/from the active circuitry in wafer 12. Upon attaching wire bond 62 to bond pad 14, an intermetallic compound (IMC) 60 is formed between wire bond 62 and bond pad 14. In one embodiment, wire bond 62 includes copper. In the embodiment in which bond pad 14 is aluminum and wire bond 62 is copper, IMC 60 includes a copper-aluminum intermetallic compound.

Figure 16:
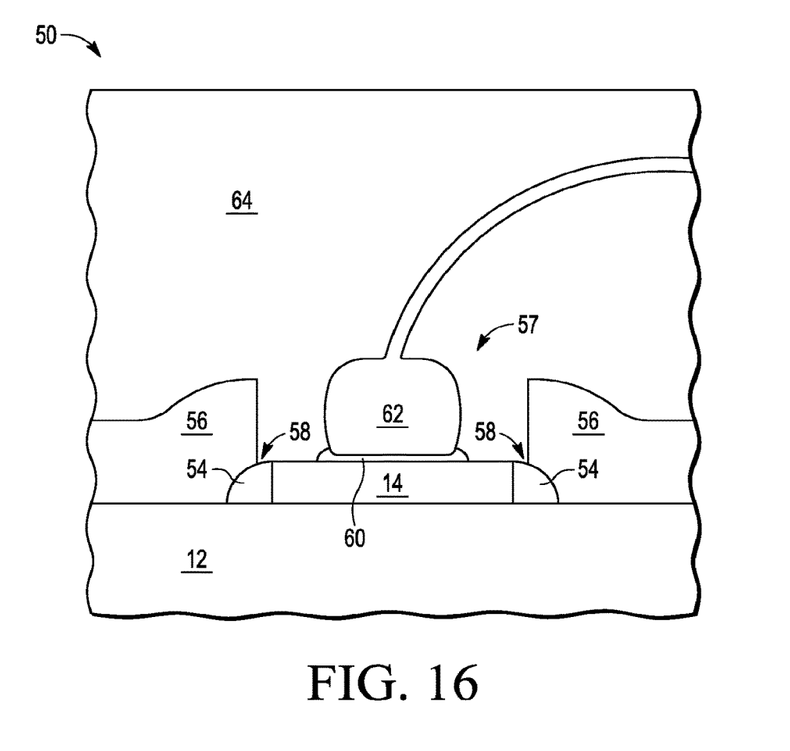

FIG. 16 illustrates, in cross section form, semiconductor structure 50 after encapsulation of structure 50 with an encapsulant 64. Encapsulant 64 fills opening 57, surrounding wire bond 62. Encapsulant 64 is therefore in direct contact portion 58 of sacrificial anode 54. Since sacrificial anode 54 has a higher redox potential than the material of bond pad 14 and IMC 60, any corrosives from encapsulant 64 will preferentially migrate to sacrificial anode 54 and corrode sacrificial anode 54 prior to corroding IMC 60. Therefore, in one embodiment, sacrificial anode 54 has sufficient volume so as to receive the corrosives, thus detracting them from IMC 60. Note also that sacrificial anode 54, when viewed from a top-down perspective, completely surrounds IMC 60. In this manner, improved corrosion protection may be achieved. Although a wire bond is illustrated as being formed on the bond area of bond pad 14, other types of conductive bonds may be formed on the bond area, such as, for example, a conductive bump or pillar. For example, the conductive bond may be a solder bump such as in a ball grid array, a copper bump, or a copper pillar.

Figure 17:
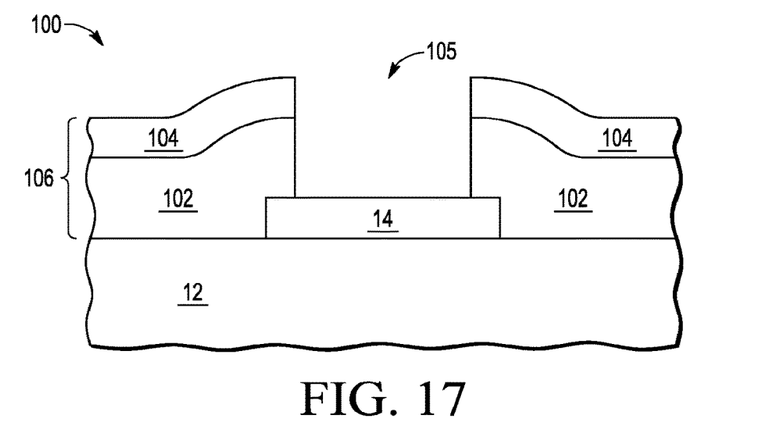
FIGS. 17-21 illustrate cross sectional views of a semiconductor structure at various stages in processing, in accordance with an embodiment.

FIG. 17 illustrates, in cross sectional form, a portion of a semiconductor structure 100 having semiconductor wafer 12 and bond pad 14 over wafer 12. As described above, in one embodiment, a conductive layer is blanket deposited over wafer 12 and subsequently patterned to form bond pad 14. A passivation layer 106 is formed over bond pad 14 having an opening 105 which exposes a bond area of bond pad 14. As will be described below, a conductive bond will be formed on the bond area. Passivation layer 106 includes a dielectric layer 102 and a dielectric layer 104 over dielectric layer 102. Each dielectric layer may be blanket deposited over wafer 12 and opening 105 can be subsequently formed such that it extends through both dielectric layer 102 and 104. In alternate embodiments, passivation layer 106 may include additional dielectric layers, in which opening 105 extends through all dielectric layers to expose the bond area of bond pad 14.

Figure 18:
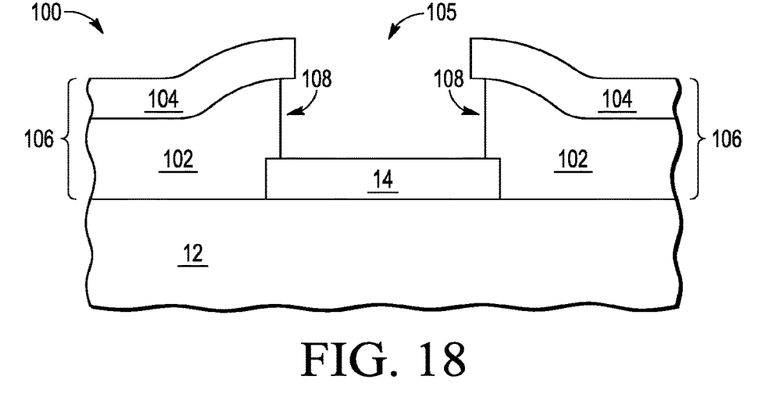

FIG. 18 illustrates, in cross sectional form, semiconductor structure 100 after forming an undercut region 108 (also referred to as an undercut area) by removing a portion of dielectric layer 102 under dielectric layer 104. An etch may be performed to form undercut region 108 such that opening 105 in dielectric layer 102 is greater than opening 105 in dielectric layer 104. In an alternate embodiment, undercut 108 area may not be formed and the sidewalls of dielectric layers 102 and 104 would remain aligned to each other.

Figure 19:
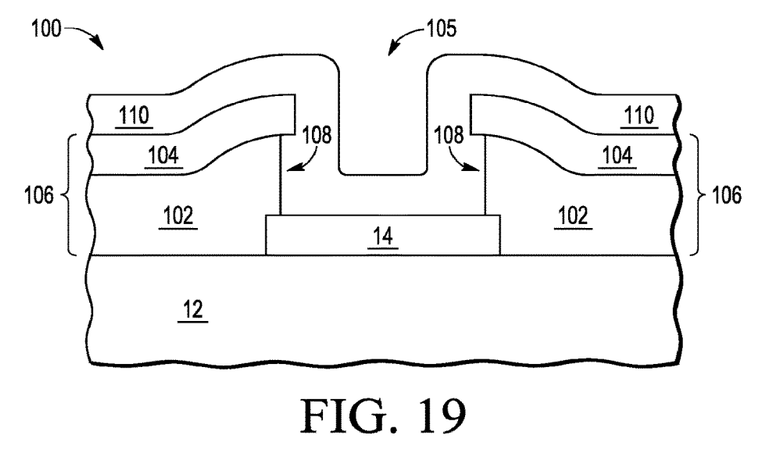

FIG. 19 illustrates, in cross sectional form, semiconductor structure 100 after formation of a sacrificial layer 110. Sacrificial layer 110 may be blanket deposited over passivation layer 106 and within opening 105. Sacrificial layer 110 includes a material having a higher redox potential than that of bond pad 14. For example, in one embodiment, sacrificial layer 110 may include magnesium.

Figure 20:
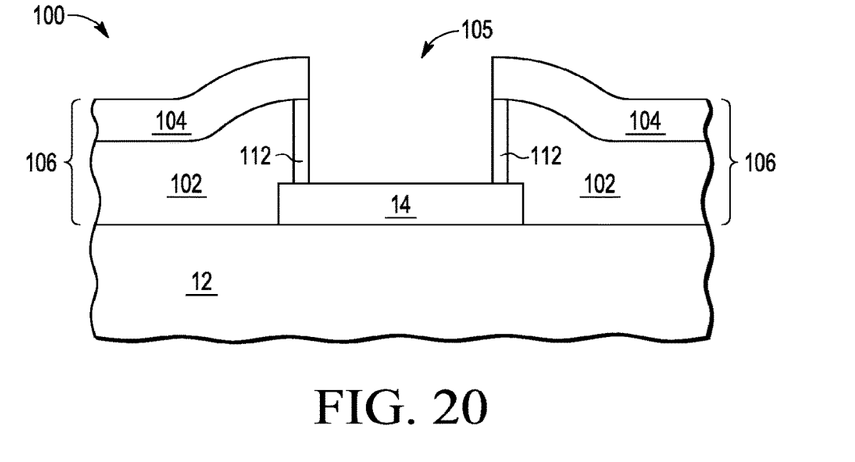

FIG. 20 illustrates, in cross sectional form, semiconductor structure 100 after performing an etch to remove portions of sacrificial layer 110 from over passivation layer 106. A remaining portion of sacrificial layer 110 forms a sacrificial anode 112 on bond pad 14 within undercut region 108. Sacrificial anode 112 surrounds two or more periphery edges of the bond area of bond pad 14. In the illustrated embodiment, sacrificial anode 112 completely surrounds the bond area. In an alternate embodiment, in which undercut region 108 is not present, the etch of sacrificial layer 110 would result in a remaining portion adjacent sidewalls of dielectric layers 104 and 102 as a sacrificial anode. This sacrificial anode would be located within opening 105, extending from a top surface of dielectric layer 104 to bond pad 14, and would also surround two or more periphery edges of the bond area.

Figure 21:
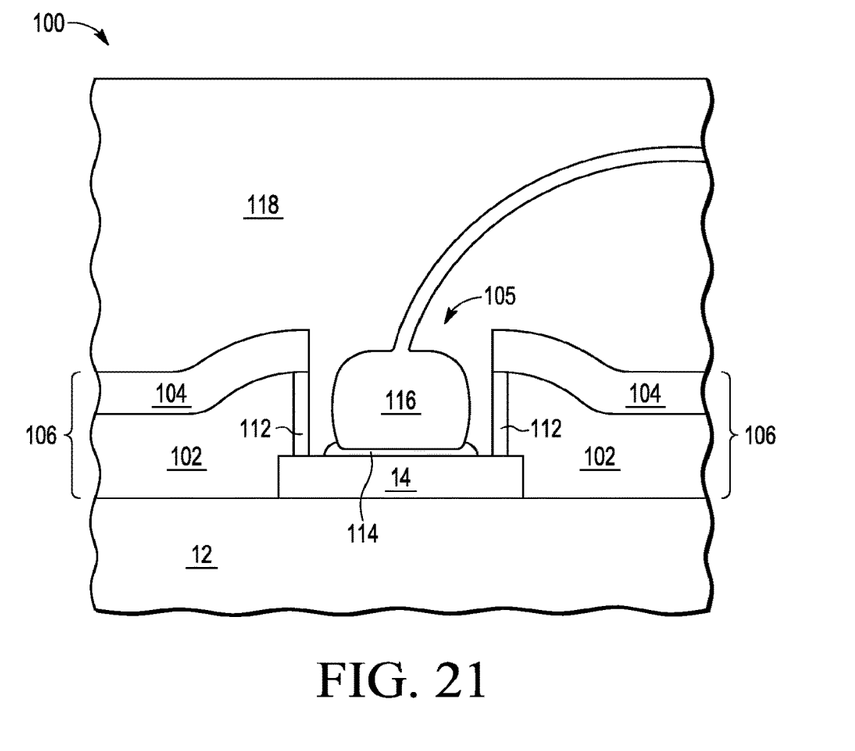

FIG. 21 illustrates, in cross section form, semiconductor structure 100 after attaching a wire bond 116 to a bond area of a top major surface of bond pad 14 and encapsulation of structure 100 with an encapsulant 118. Wire bond 116 may used to provide an electrical connection to/from the active circuitry in wafer 12. Upon attaching wire bond 116 to bond pad 14, an intermetallic compound (IMC) 114 is formed between wire bond 116 and bond pad 14. In one embodiment, wire bond 116 includes copper. In the embodiment in which bond pad 14 is aluminum and wire bond 114 is copper, IMC 114 includes a copper-aluminum intermetallic compound. Encapsulant 118 fills opening 105, surrounding wire bond 116. Encapsulant 118 is therefore in direct contact with sacrificial anode 112 (which would be the case regardless of whether undercut 108 were formed or not). Since sacrificial anode 118 has a higher redox potential than the material of bond pad 14 and IMC 114, any corrosives from encapsulant 118 will preferentially migrate to sacrificial anode 112 and corrode sacrificial anode 112 prior to corroding IMC 114. Therefore, in one embodiment, sacrificial anode 112 has sufficient volume so as to receive the corrosives, thus detracting them from IMC 114. Note also that sacrificial anode 112, when viewed from a top-down perspective, completely surrounds IMC 114. In this manner, improved corrosion protection may be achieved. Although a wire bond is illustrated as being formed on the bond area of bond pad 14, other types of conductive bonds may be formed on the bond area, such as, for example, a conductive bump or pillar. For example, the conductive bond may be a solder bump such as in a ball grid array, a copper bump, or a copper pillar.

Therefore, by now it can be appreciated how a sacrificial anode which surrounds two or more periphery edges of a bond area may be used to improve reliability by attracting corrosives which would otherwise attack the IMC of the conductive bond. Furthermore, the sacrificial anode may further protect against other elements susceptible to corrosion in addition to the IMC such as, for example, other bonds within the semiconductor structure, bond wires, bond pads, pillars (e.g. copper pillars), etc.

The semiconductor substrate described herein can be any semiconductor material or combinations of materials, such as gallium arsenide, silicon germanium, silicon-on-insulator (SOI), silicon, monocrystalline silicon, the like, and combinations of the above.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the sacrificial anode may be used to protect a variety of different types of bond structures. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method for fabricating a semiconductor structure including forming a conductive layer on a integrated circuit (IC) wafer; forming a first sacrificial layer over a major surface of the conductive layer; forming a passivation layer over the first sacrificial layer; removing a portion of the passivation layer and a portion of the first sacrificial layer from a bond area on the major surface of the conductive layer; and forming an encapsulating material over the passivation layer and in contact with an exposed portion of the sacrificial layer. Item 2 includes the method of item 1 and further includes forming a conductive bond on the bond area before the forming the encapsulating material. Item 3 includes the method of item 1, wherein prior to the forming the passivation layer, the method further includes: patterning the conductive layer and the first sacrificial layer; forming a second sacrificial layer over the patterned conductive layer and the patterned first sacrificial layer; and etching the second sacrificial layer to form a spacer along sidewalls of the first sacrificial layer and the conductive layer. Item 4 includes the method of item 3, wherein the removing the portion of the passivation layer and the portion of the first sacrificial layer includes removing a portion of the first sacrificial layer over the bond area to form a sacrificial anode of the first sacrificial layer while leaving the spacer intact. Item 5 includes the method of item 3 wherein the forming the encapsulating material includes forming the encapsulating material over the passivation layer and in contact with an exposed portion of the first sacrificial layer. Item 6 includes the method of item 2 wherein the conductive pad is formed of aluminum and the conductive bond is formed of copper. Item 7 includes the method of item 1 wherein the sacrificial layer has a higher redox potential than the conductive layer. Item 8 includes the method of item 1 wherein the forming the passivation layer includes forming a first passivation layer over the major surface of the conductive layer and along the sidewalls of the conductive layer; forming a second passivation layer over the first passivation layer; forming a layer of photo resist to mask the first and second passivation layers round the conductive layer; removing unmasked portions of the first and second passivation layers including forming an undercut area in the first passivation layer adjacent the major surface of the conductive layer. Item 9 includes the method of item 8 wherein the forming the sacrificial layer includes: depositing the sacrificial layer over the second passivation layer, in the undercut areas and over the major surface of the conductive layer; etching the sacrificial layer to form a sacrificial anode around the bond area.

Item 10 includes a packaged semiconductor device including a semiconductor wafer; a conductive pad on a surface of the wafer; a sacrificial material surrounding two or more peripheral edges of a bond area on the conductive pad; a conductive bond in the bond area; and encapsulant material formed over the conductive bond and in direct contact with the sacrificial material. Item 11 includes the device of item 10, wherein the sacrificial material is formed of a first sacrificial layer and a second sacrificial layer, the first sacrificial layer forms a sacrificial spacer around a periphery of the conductive pad and the second sacrificial layer forms a sacrificial anode in contact with the surface of the wafer around the peripheral edges of the bond area. Item 12 includes the device of item 10, and further includes a passivation layer formed adjacent to the exposed portion of the sacrificial material. Item 13 includes the device of item 10, wherein the conductive pad is formed of aluminum and the conductive bond is formed of copper. Item 14 includes the device of item 10, wherein the sacrificial layer has a higher redox potential than the conductive pad.

Item 15 includes a method of making a packaged semiconductor device including forming a conductive pad on an external surface of an integrated circuit device; forming a passivation layer over the conductive pad; removing a portion of the passivation layer over a bond area on the conductive pad; forming a sacrificial anode around a majority of a periphery surrounding the bond area; forming a conductive bond in the bond area; and forming an encapsulating material around the conductive bond and an exposed portion of the sacrificial anode. Item 16 includes the method of item 15, wherein the forming the passivation layer includes forming a first passivation layer and a second passivation layer adjacent the periphery surrounding the bond area; forming an undercut area in the first passivation layer so that a portion of the second passivation layer overlies the undercut area; forming the sacrificial anode in the undercut area. Item 17 includes the method of item 15, wherein the forming the sacrificial anode includes: forming a first portion of the sacrificial anode around sidewalls of the conductive pad and forming a second portion of the sacrificial anode on a top surface of the conductive pad and in direct contact with the first portion of the sacrificial anode. Item 18 includes the method of item 15, wherein the forming the sacrificial anode includes forming material with a higher redox potential than the conductive pad around sidewalls of the conductive pad. Item 19 includes the method of item 15, wherein the conductive bond is one of a group consisting of: a wire bond, a solder bump in a ball grid array, a copper bump, a copper pillar. Item 20 includes the method of item 15, wherein the sacrificial anode a higher redox potential than the conductive pad.

What is claimed is:

1. A packaged semiconductor device comprising:
   a semiconductor wafer;
   a conductive pad directly on a surface of the wafer;
   a sacrificial material surrounding two or more peripheral edges of a bond area on the conductive pad;
   a conductive bond in the bond area, wherein the sacrificial material is spaced apart from the conductive bond such that the sacrificial material is not in contact with the conductive bond; and
   encapsulant material formed over and in direct contact with the conductive bond and in direct contact with the sacrificial material.

2. The device of claim 1 wherein the sacrificial material is formed of a first sacrificial layer and a second sacrificial layer, the first sacrificial layer forms a sacrificial spacer around a periphery of the conductive pad and the second sacrificial layer forms a sacrificial anode in contact with the surface of the conductive pad around the peripheral edges of the bond area.

3. The device of claim 1 further comprising:
   a passivation layer formed adjacent to an exposed portion of the sacrificial material.

4. The device of claim 1 wherein the conductive pad is formed of aluminum and the conductive bond is formed of copper.

5. The device of claim 1 wherein the sacrificial layer has a higher redox potential than the conductive pad.

6. The device of claim 1 wherein the conductive bond is one of a group consisting of: a wire bond, a solder bump in a ball grid array, a copper bump, a copper pillar.

7. The device of claim 3 wherein:
   the passivation layer includes an opening in which sidewalls of the opening are located directly over the conductive pad.

8. The device of claim 7 wherein the passivation layer comprises:
   an undercut region in a portion of the sidewalls located wherein the undercut region is located directly over the conductive pad, and the sacrificial material is located in the undercut region and directly on the conductive pad.

9. The device of claim 8 wherein:
   the passivation layer includes multiple layers, wherein the undercut region is located in sidewalls of at least one layer under a top layer of the multiple layers.

10. The device of claim 9 wherein:
    the sacrificial material is aligned to sidewalls of the top layer of the multiple layers.

11. The device of claim 1 wherein:
    the sacrificial material surrounds the conductive pad and is in physical contact with all sidewalls of the conductive pad.

12. The device of claim 11 further comprising:
    a passivation layer between the semiconductor wafer and the encapsulant material wherein the passivation layer includes an opening in which sidewalls of the opening are located directly on the sacrificial material.

13. The device of claim 2 further comprising:
    a passivation layer formed over the conductive pad and sacrificial material, wherein the sacrificial anode is located between the passivation layer and conductive pad, and the sacrificial spacer is located between the passivation layer and the semiconductor wafer.

14. A packaged semiconductor device comprising:
a semiconductor wafer;
an aluminum pad directly on a top surface of the wafer;
a sacrificial material surrounding two or more peripheral edges of a bond area on the aluminum pad, wherein the sacrificial layer has a higher redox potential than the aluminum pad;
a copper bond in the bond area, wherein the sacrificial material is spaced apart from the copper bond such that the sacrificial material is not in contact with the copper bond; and
encapsulant material formed over and in direct contact with the copper bond and in direct contact with the sacrificial material.

15. A packaged semiconductor device comprising:
a semiconductor wafer;
a conductive pad directly on a surface of the wafer;
a sacrificial material surrounding and in direct contact with two or more sidewalls of the conductive pad;
a conductive bond in a bond area of the conductive pad, wherein the sacrificial material is spaced apart from the conductive bond; and
encapsulant material formed over and in direct contact with the conductive bond and in direct contact with the sacrificial material.

16. The device of claim 15 wherein the sacrificial material is formed of a first sacrificial layer and a second sacrificial layer, the first sacrificial layer forms a sacrificial spacer surrounding and in direct contact with the two or more sidewalls of the conductive pad and the second sacrificial layer forms a sacrificial anode directly on the surface of the conductive pad around the peripheral edges of the bond area and in direct contact with the sacrificial spacer.

17. The device of claim 15 further comprising:
a passivation layer between the semiconductor wafer and the encapsulant material wherein the passivation layer includes an opening in which sidewalls of the opening are located directly on the sacrificial material.

18. The device of claim 16 further comprising:
a passivation layer over the conductive pad and sacrificial material, wherein the sacrificial anode is located between the passivation layer and conductive pad, and the sacrificial spacer is located between the passivation layer and the semiconductor wafer.

19. The device of claim 15 further comprising:
a passivation layer over the conductive pad having an opening in which sidewalls of the opening are located directly over the conductive pad.

* * * * *